United States Patent [19]

Wagner et al.

[11] Patent Number: 4,871,433

[45] Date of Patent: Oct. 3, 1989

[54] METHOD AND APPARATUS FOR IMPROVING THE UNIFORMITY ION BOMBARDMENT IN A MAGNETRON SPUTTERING SYSTEM

[75] Inventors: Israel Wagner, Monsey, N.Y.; Steven D. Hurwitt, Park Ridge, N.J.

[73] Assignee: Materials Research Corporation, Orangeburg, N.Y.

[21] Appl. No.: 95,560

[22] Filed: Sep. 10, 1987

Related U.S. Application Data

[63] Continuation of Ser. No. 848,750, Apr. 4, 1986, abandoned.

[51] Int. Cl.$^4$ ............................................. C23C 14/34
[52] U.S. Cl. ........................ 204/192.12; 204/192.32; 204/298
[58] Field of Search ............... 204/298, 192.1, 192.12, 204/298 TT, 298 ME, 298 PM, 298 E, 298 EE, 192.32; 156/345; 118/673, 728; 427/38, 39, 47

[56] References Cited

U.S. PATENT DOCUMENTS

| | | | |
|---|---|---|---|
| 4,132,613 | 1/1979 | Penfold et al. | 204/298 |
| 4,414,086 | 11/1983 | Lamont, Jr. | 204/298 |
| 4,422,896 | 12/1983 | Class et al. | 204/298 |
| 4,431,473 | 2/1984 | Okano et al. | 204/298 |
| 4,466,872 | 8/1984 | Einbinder | 204/298 |
| 4,472,259 | 9/1984 | Class et al. | 204/298 |
| 4,525,262 | 6/1985 | Class et al. | 204/298 |
| 4,581,118 | 4/1986 | Class et al. | 204/298 |
| 4,627,904 | 12/1986 | Mintz | 204/298 |
| 4,721,553 | 1/1988 | Saito et al. | 204/298 |

FOREIGN PATENT DOCUMENTS

| | | |
|---|---|---|
| 136230 | 7/1985 | Japan . |
| 152671 | 8/1985 | Japan . |
| 1358411 | 7/1974 | United Kingdom . |

*Primary Examiner*—Nam X. Nguyen
*Attorney, Agent, or Firm*—Wood, Herron & Evans

[57] ABSTRACT

A magnetron sputtering apparatus and method, in which the ion flux bombarding the substrate is made uniform. Countermagnet means are chosen and positioned such that the vertical components of the countermagnet field are of opposite direction and equal magnitude to the vertical components of the cathode magnet in the vicinity of the substrate. Thus, the cathode magnetic field lines become substantially flat in the vicinity of the substrate and do not cause the ion flux to be distributed on the substrate surface in a non-uniform manner. Measurement of ion current density on the substrate surface during operation of the invention reveals that the invention provides substantially constant flux at all points on the substrate surface.

30 Claims, 2 Drawing Sheets

METHOD AND APPARATUS FOR IMPROVING THE UNIFORMITY ION BOMBARDMENT IN A MAGNETRON SPUTTERING SYSTEM

This is a continuation, of application Ser. No. 848,750, filed Apr. 4, 1986, abandoned.

BACKGROUND OF THE INVENTION

This invention relates to the field of sputter coating, and more particularly to the field of improving the quality of a thin film coated by sputtering techniques.

This application is related to the application entitled "Improved Cathode and Target Design for a Sputtering Apparatus," and applications entitled "Method and Apparatus for Handling and Processing Wafer-Like Articles," all filed on even date herewith.

Sputtering is an important technique for applying thin films to substrate materials, such as wafers utilized in manufacturing microelectronic components. The process can best be envisioned as a series of steps, occurring in a low-pressure chamber into which a gas, typically argon, has been introduced. A negative potential is applied to a cathode structure, inducing an electric field, and electrons collide with argon atoms, creating ions and exciting a glow discharge. Accelerated by the cathode's negative potential, the ions travel parallel to the electric field lines and impact a target, composed of the coating material, carried in the cathode structure. The kinetic energy of these ions is sufficiently high to dislodge some target surface atoms, which then condense on the substrate to form the film. Also, ion bombardment causes the emission of secondary electrons from the target, and those electrons ionize more argon atoms, and so on, in an "avalanche" effect.

One method used in the sputtering art has been the employment of magnetic fields to enhance plasma density, which in turn enhances the ion bombardment of the target. In such apparatus, referred to as magnetron sputtering devices, magnetic means are disposed to induce a relatively strong field in the vicinity of the target face, with the magnetic field lines oriented generally perpendicular to those of the electric field. Electrons emitted from the target face are influenced by the magnetic field so that their path of motion becomes curved, and in effect, the magnetic field traps the electron in the vicinity of the target. The effect of this action is to promote electron-argon collisions close to the target face, maximizing the ion flux bombarding the target. Typical of magnetron sputtering apparatus is the device disclosed in U.S. Pat. No. 4,472,259, assigned to the assignee of the present invention.

Sputtering is employed as discussed above (conventional sputter coating), or in one of three variant processes. If it is desired to remove material from a substrate, rather than deposit a film, the apparatus can be arranged so that the substrate becomes the target of the ion bombardment. Usually the object is to achieve the removal of material, for example, to prepare a silicon wafer for the deposition of interconnection and component material in other process steps. Additionally, it is possible to affect the substrate during etching by employing reactive sputter etching, in which a reactive gas, such as oxygen or chlorine, is added to the argon in the sputtering chamber. Radicals of the reactive gas react with the substrate to form volatile compounds, so that film removal proceeds by a combination of sputter etching and chemical actions.

Also, if ion bombardment of the substrate during formation of the film is advantageous, that result can be achieved through bias sputtering, in which a negative bias, typically of less magnitude than that applied to the cathode, is impressed upon the substrate. Under the influence of this bias, a "secondary" ion flux (as distinguished from the "primary" ion flux that bombards the target) impinges upon the substrate simultaneously with the coating material atoms. As reported by Chapman in "Glow Discharge Processes", pp. 231-32 (1980), bias sputtering can be particularly useful when attempting to coat three-dimensional surface configurations, typically microscopic steps and holes formed in the substrate surface, generally having depth and width dimensions under one thousandth of an inch. Such surfaces are typically found on microelectronic component wafers, and have long posed a problem for effective application of films, especially the uniform coverage of perpendicular walls.

A measure of the effectiveness of a given system in coating such surfaces is referred to as "step coverage," defined as the ratio of nominal film thickness to the minimum thickness, typically found at either the top or bottom corners of a vertical step. It will be appreciated that a low value of step coverage leads to early failure of electronic devices, as the increased resistance at such points causes material migration or heat buildup that can lead directly to circuit failure. Bias sputtering often is employed in such situations, but as Chapman notes, the problem remains acute.

Users of devices produced by sputtering technology, however, are now demanding products that stretch and exceed the capabilities of the present sputtering art. For example, typical wafer geometries now in the production stage call for surface steps three microns wide by one micron deep. Newer designs seek to pack more devices on a single chip, and require coating surface steps only one micron wide by one micron deep, and designs in the very near future will specify half that width.

When the shape of the step approaches a square configuration, the sides of the step begin to act as a mask, effectively blocking coating material atoms from reaching the bottom corners of the step. At the very least, this tendency produces reduced step coverage, and in the extreme can lead to the formatiom of "tunnels" or "mouse holes" in the coating, in which material applied to the sides of a step grows outward to make contact with material applied to the opposite side, leaving the interior almost completely devoid of coating. This effect can be very detrimental to performance of the final device, and would be most undesirable under proposed coating regimes in which planar coatings (all steps completely filled, and a further thickness of film atop the entire wafer, producing a substantially flat final surface) rather than conventional conformal coatings are required.

A complicating factor in bias sputtering is the presence of variations in the "secondary" ion flux, resulting from the effects of the magnetic field used to enhance bombardment of the sputtering target. As mentioned, one observed effect of bias sputtering is an improvement in step coverage, possibly through increasing the mobility of the surface material during film formation. It will be apparent that non-uniformities in flux across the surface of the substrate will produce detrimental effects. If it is important, for example, to achieve good step coverage, then a non-uniform "secondary" flux will result in a product having areas of poor coating quality, observable, for example as variations in step coverage in different areas of the substrate. When coating silicon wafers for the semiconductor industry, this non-uniformity directly leads to high loss rates.

Thus, non-uniformity of the "secondary" ion flux in a bias sputtering system stands as an obstacle to the effective employment of this technique in meeting the needs of the sputtering industry's customers. It is to this problem that the present invention is addressed.

SUMMARY OF THE INVENTION

The broad object of this invention is the provision of a sputter coating system capable of delivering a uniform ion flux to the surface of a substrate.

Another object of the invention is the control of portions of a sputtering system cathode magnetic field extending to the vicinity of the substrate.

Yet another object of the present invention is the improvement of the step coverage of sputter coating systems.

Still another object of the invention is a method for sputter coating that results in a uniform ion flux at the system substrate.

A separate object of the invention is a sputtering system capable of producing a more uniform mobility of sputtered material on the surface of the substrate.

These and other objects are accomplished in the present invention, which includes countermagnet means for controlling the fringing magnetic field emanating from the cathode and extending to the vicinity of the substrate. The countermagnet means of the present invention is defined primarily in terms of the cathode magnet, in that the countermagnet functions to reduce the vertical component of the magnetic field in the vicinity of the substrate to a negligible level. As a result, the magnetic field lines in the vicinity of the substrate are generally parallel to the surface of the substrate, resulting in a uniform distribution of ion flux across the substrate surface.

Although the invention can take many forms, depending upon the configuration of the cathode magnetic system, one embodiment of the invention is directed to a system employing a circular cathode, with a target assembly facing a substrate carried on a support. The substrate is biased at a negative voltage generally less than the bias applied to the cathode. The magnetic means of this embodiment is disposed such that the vertical components of the two magnetic fields are in opposition, resulting in the magnetic field lines in the vicinity of the substrate being substantially parallel to the substrate surface. Thus, the cathode magnetic means no longer has a distorting effect upon the "secondary" ion flux impacting the substrate—that is, the ion flux at the substrate is uniform. Measuring the ion current on the substrate surface confirms that the ion flux has been made uniform.

DETAILED DESCRIPTION OF PREFERRED EMBODIMENTS

Figure 1:
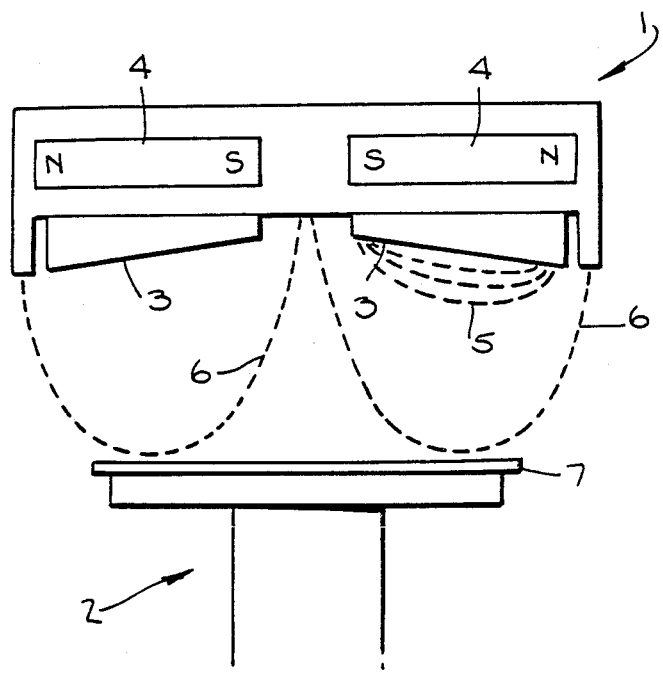
FIG. 1 is a cross-sectional side view of a schematic representation of a typical prior art bias sputtering system.

Understanding of the present invention will be facilitated by a consideration of the prior art and the limitations inherent therein. FIG. 1 shows a typical prior art bias sputtering apparatus, in which a circular cathode assembly 1 faces a substrate support 2, carrying the substrate 7 to be coated. A negative bias, typically in a range from about 50 to 300 volts is applied to the substrate. The cathode assembly includes a target 3, composed of coating material, and magnet means 4. It should be noted that the structure shown here is typical, but not exhaustive. For example, cathode structures take a wide variety of forms, including magnet means of many shapes, some including pole pieces to shape the cathode magnetic field. However these systems may be constructed, they share the operational characteristics noted herein. The magnet means induce a magnetic field in the vicinity of the target, primarily in the area shown by dotted lines 5. This field does, of course, extend further outward, and "fringing" field lines 6 exist, curving outward from the target to the vicinity of the substrate.

Figure 3:
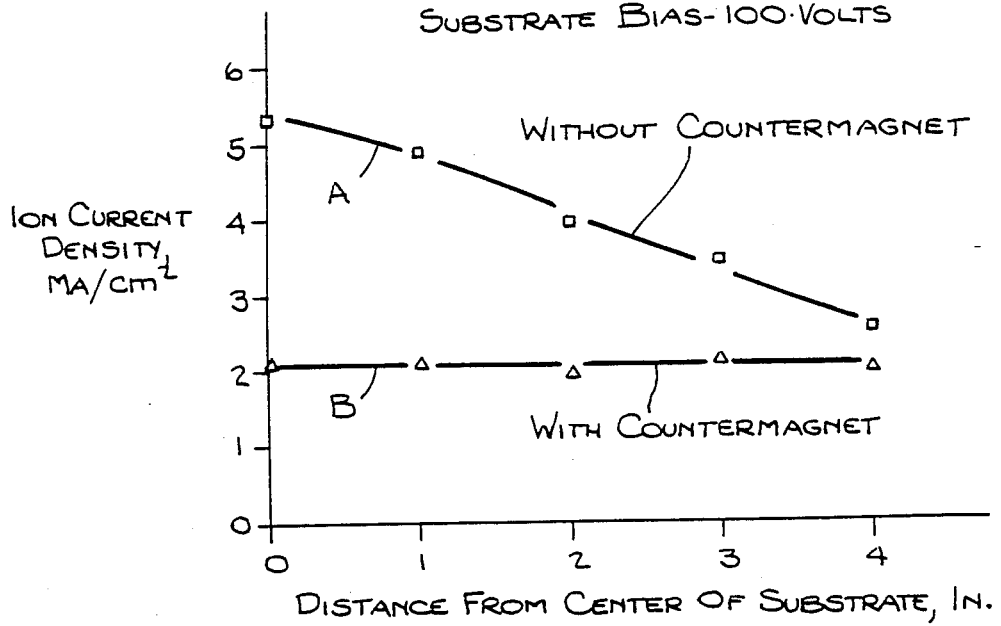
FIG. 3 graphically depicts the ion current measured at the substrate surface of the sputtering systems of FIGS. 1 and 2.

Two phenomena related to this system can be observed directly. First, the ion flux impacting the substrate is highly non-uniform. Curve A, FIG. 3, depicts a measurement of ion current at the substrate (in $mA/cm^2$) at distances spaced from the center of the substrate. As can be seen, the ion flux is at a high level in the center of the substrate, but falls off rapidly to a relatively low level toward the substrate edges. Thus, whatever effect the ion flux has on the developing film, that effect will be uneven, depending on the level of ion current at a given point on the surface.

Second, a visible glow region exists, having a general funnel shape similar to that of the inner portion of lines 6, extending over most of the substrate surface and curving upward and inward toward the center of the target. This glow region does not occur in conventional sputter coating, but only appears in bias sputtering.

The probable theoretical explanation for these phenomena is as follows. It is known that one result of the "primary" ion flux impacting the target is secondary electron emission from the target surface. Over most of the target surface, such electrons are confined by the target magnetic field, travelling within that field to produce more ions. At the center of the target, however, the cathode magnetic field lines are generally perpendicular to the target surface (and thus parallel to the electric field lines). Clearly, electrons ejected from this area are not captured by the cathode field, but travel away from the target surface, spiralling around the magnetic field lines.

At the exact center of the target, electrons follow a path normal to the target, but those slightly separated from the center curve gradually outward toward the edge of the substrate, following the general path of lines 6. This electron flux excites a "secondary" glow discharge in the area of the "fringing" field, and this discharge produces the "secondary" flux that bombards the substrate. Because the flux density will be proportional to the electron flux that produces the discharge, it follows that the highest flux density will be seen in the region above the center of the target, and hence above the center of the substrate. Therefore, the center of the substrate will experience a higher ion flux than do the edges.

In the absence of substrate bias (or at very low bias levels), of course, the substrate would not experience a "secondary" ion flux, but it would be subjected to a flux of secondary electrons emitted by the target and escaping from the cathode magnetic field as discussed above. Secondary electrons would not affect the growing film as do incoming ions, but this flux would raise the temperature of the substrate. To the extent that this flux is non-uniform, this heating effect also would be non-uniform, creating areas of higher temperature ("hot spots") on the substrate surface. If, as is often the case, the substrate specification requires close control of temperature during the coating process (for example, when applying a film atop already-coated layers of material), the existence of such "hot spots" poses a design problem and an operational problem. Thus, the effects of the cathode field upon the coated film extend beyond the realm of bias sputtering.

The increasingly stringent standards expected by users of thin-film products not only points to the growing impact of the problem noted here, but it also carries another effect, not so immediately apparent. As Chapman notes, the conventional response to step coverage problems has been to raise the substrate bias level. Of course, higher bias levels also increase the ion flux level, which produces additional heat in the substrate. The present state of the art of coating silicon wafers with aluminum, for example, calls for bias levels that produce temperatures approaching the melting point of the film. A film melt of course, would not merely cause a higher failure rate in the devices produced from the wafer, but would likely cause the loss of the entire wafer, at a substantial cost. Thus, rather than risk that non-uniformities will produce a flux above nominal levels, resulting in possible melting of the film, conventional designs allow for the non-uniformity by setting "secondary" flux maximum levels well below the film melting point, accepting poor step coverage at the periphery of the wafer.

Figure 2:
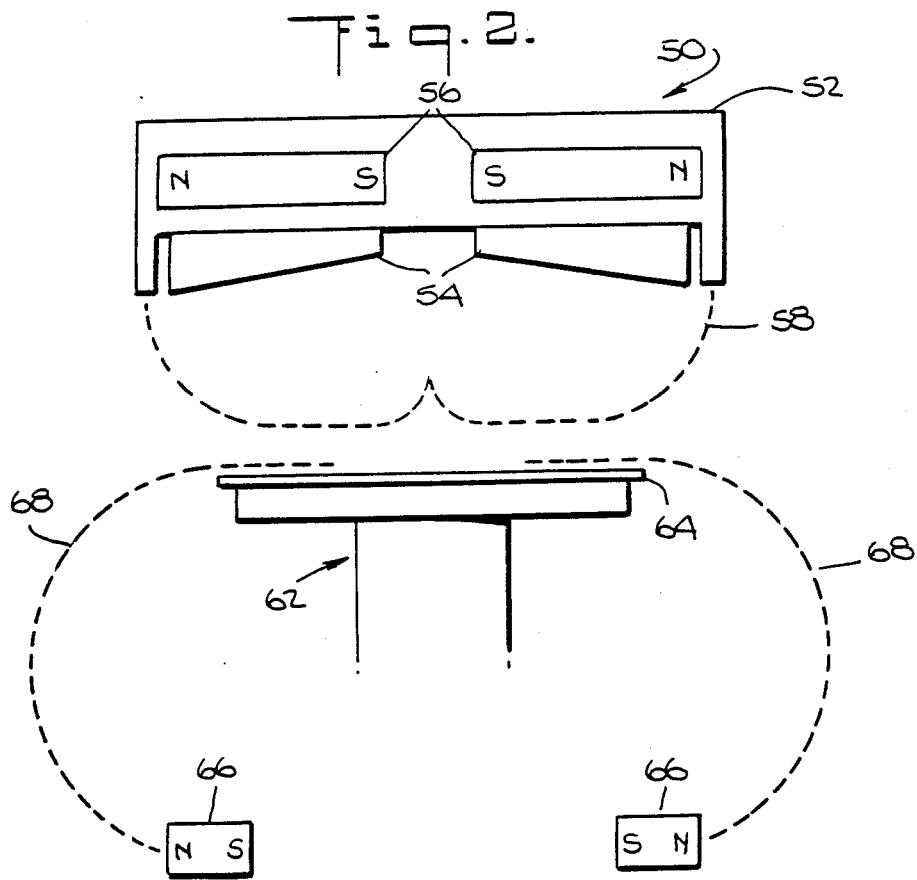
FIG. 2 is a cross-sectional side view of a schematic representation of an embodiment of the present invention.

The sputtering apparatus of the present invention provides for improved sputtering results by making the "secondary" ion flux uniform at the substrate surface. The embodiment shown in FIG. 2 employs a circular arrangement, suitable for coating circular wafers, but of course those in the art will be able to accommodate the invention to a variety of design formats. The cathode and target assembly 50 of FIG. 2 echoes that of the prior art design, with cathode body 52, target 54, and magnet means 56. A substrate support 62 faces the cathode assembly, carrying substrate 64. Unlike the prior art device, however, the present invention includes a countermagnet means 66 that induces field lines 68, extending around the substrate. The primary effect of this magnet can be seen in the cathode "fringing" field lines 58; rather than having the generally toroidal shape of the prior art device, they have assumed a generally flattened shape. This effect occurs because the field components perpendicular to the target/substrate planes are in opposition, leaving both fields oriented substantially parallel to the target/substrate planes.

The direct effect of the countermagnet can be seen and measured. Curve B, FIG. 3, depicts a repetition of the ion current measurement across the face of the substrate, with the countermagnet in operation. The result reveals an even distribution of flux on the substrate, with the ion current at the center at about the level seen at the substrate edge in the previous measurement. Therefore, the effect produced by the ion flux will be uniform throughout the substrate surface. Additionally, the visible "secondary" glow discharge disappears, indicating a diminution in the influence of the cathode field.

Those in the magnetron sputtering art will understand the process underlying the selection of the site and position of the countermagnet. In the embodiment shown, the magnet approximates the size and construction of the cathode magnet 56, having its poles aligned in the same orientation as that of the cathode magnet. One should not look to the poles of the two magnets alone, however, as the key point is the orientation of the field lines, and more particularly, the orientation of the field components normal to the target/substrate planes. The latter components should be in opposition to produce the desired flattening of the cathode "fringing" field.

Furthermore, the countermagnet should be positioned such that the interaction between its field and that of the cathode results in the desired flattening of the cathode "fringing" field. Of course, this results can be achieved by a wide range of magnet choices, including smaller magnets placed relatively close to the substrate or larger magnets located at a greater distance, whether within or without the sputtering chamber.

Rather than measuring field strength, however, the discussion above provides the best approach to choosing appropriate countermagnet means for a given application. One should begin by measuring the ion current at points spaced from the substrate center. Then, a starting point for choosing the countermagnet could be a replication of the cathode magnet, positioned at a point relatively distant from the substrate, as shown. Further measurements will reveal an optimum countermagnet size and location for the specific apparatus, as will be understood by those in the art.

The composition and structure of the countermagnet may take any of the forms familiar to those in the magnetron sputtering art. In the embodiment shown, it is preferred to employ a generally circular, conventionally fabricated, magnet. One could, however, employ an electromagnet, with or without a solenoid-type winding. Plate magnets or bar magnets could also be arranged in suitable patterns to produce the desired effect. Additionally, pole pieces, as known in the art, may be employed to shape the countermagnet field to produce the desired effect in a particular system.

An alternative employment of the embodiment shown should be considered. Some users prefer to perform a sputter etching step before a deposition operation, having the wafer in position for bias or conventional sputtering during the etching step. In normal sputter etching, of course, it is not necessary to consider the effects of the cathode magnetic field as discussed above, because that structure does not exist in the same form. In this instance, however, it has been observed that the cathode field exerts the same effect upon the etching ion flux that it does upon the secondary ion flux: the field is made non-uniform, producing uneven etching.

In a situation of etching carried out in the presence of a cathode (notwithstanding that the cathode has no power applied during the etching step), provision of countermagnet means such as those disclosed herein will improve etching results just as such means improve bias sputtering. The etching flux will be made uniform, so that material will be removed from the substrate surface the same degree, regardless of position on the substrate. Those in the art will understand that selection and position of countermagnet means for such applications follows the same steps as outlined above.

Persons skilled in the magnetron sputtering art will understand that modifications and variations to the embodiment discussed above will be required to adapt the invention to specific sputtering requirements. For example, the sputtering system discussed above is adapted to coating circular substrates in a batch mode, typical of the semiconductor coating field. Continuous coating of flat, elongated substrates would require cathode and substrate support structures departing substantially from those depicted herein, but the principles outlined will allow those in the art to design and install countermagnet means effective in assuring uniform ion flux across the substrate. These and other modifications may be made within the spirit of the invention, the scope of which is defined solely by the claims appended hereto.

We claim:

1. A sputtering method for imparting a uniform secondary ion flux distribution upon a substrate, comprising the steps of:
   providing a cathode assembly including a cathode target of coating material and cathode magnet means, in opposed, spaced relation with a substrate to be coated;
   inducing a cathode magnetic field with said cathode magnet means, said cathode field including a fringing field portion in the vicinity of said substrate, said fringing field having one or more regions near the substrate where its magnetic field lines have components perpendicular to the surface of the substrate;
   creating a primary ion flux and a secondary ion flux, both originating from within said cathode magnetic field in the space between said fringing portion and said cathode target;
   bombarding said cathode target with said primary ion flux, to eject portions of coating material;
   impacting said substrate with said secondary ion flux; and
   generating a countermagnetic field, in the vicinity of said substrate, having magnetic field components in a direction perpendicular to the substrate which are located so as to oppose the components of the cathode magnetic field perpendicular to the substrate in each of said one or more regions.

2. The method of claim 1, wherein said generating step generates a countermagnet field wherein said perpendicular components of field lines of said countermagnetic field in the vicinity of said substrate have substantially opposing direction and substantially equal magnitude to components of said cathode magnetic field perpendicular to said substrate in said substrate surface vicinity.

3. The method of claim 1, wherein said generating step generates a countermagnetic field which opposes said cathode magnetic field in the vicinity of said substrate such that the magnetic field lines assume a substantially flat shape near said substrate surface.

4. The method of claim 1 wherein the generating of said countermagnetic field is by means of countermagnet means chosen to make the ion current uniform across the substrate.

5. The method of claim 1 wherein said countermagnetic means is chosen by replication of the cathode magnet means optimized in size and location in response to measurements of ion current.

6. The method of claim 1 wherein the generating of said countermagnetic field is by means of countermagnet means chosen in response to measurement of ion current across said substrate.

7. A sputtering method for impacting a uniform ion flux upon a substrate, said method comprising the steps of:
   providing a cathode assembly including cathode magnet means;
   disposing a substrate having a surface in spaced relationship with and facing said cathode assembly;
   inducing a primary magnetic field closely adjacent to said cathode assembly with said cathode magnet means, said primary field including a fringe field portion extending to the vicinity of said substrate and including components perpendicular to the surface of said substrate near at least one inner portion thereof;
   impacting said substrate with an ion flux;
   disposing a countermagnet means adjacent to said substrate; and
   making said ion flux uniform across said substrate by generating a secondary magnetic field by means of said countermagnet means, said secondary field including field lines having components extending substantially perpendicular to the surface of said substrate at each said inner portion and in a direction opposite to the components of said primary magnetic field perpendicular to the substrate to substantially flatten the magnetic field in the vicinity of said surface substantially parallel thereto such that said ion flux is substantially uniform.

8. The method of claim 7 wherein said generating step generates a countermagnetic field wherein said components of said field lines of said secondary field at each said inner portion of said substrate are of substantially equal magnitude to said components of said primary magnetic field perpendicular to said substrate in said substrate vicinity.

9. Apparatus for sputter coating a substrate, said apparatus comprising:
   a cathode assembly including a target composed of coating material and cathode magnet means for producing a primary magnetic field closely adjacent said target to enhance ion bombardment of said target with a primary ion flux, said primary magnetic field including a fringe field extending adjacent to said substrate and having a component substantially perpendicular to said surface of the substrate at at least one interior portion of said substrate;
   means for creating said primary ion flux and a secondary ion flux originating from within said primary magnetic field between said fringe field and said target;
   means for mounting said substrate spaced apart from and facing said cathode target;
   means including negative biasing means for impacting said secondary ion flux onto said substrate; and
   means for uniformly impacting said substrate with said secondary ion flux, including countermagnet means for producing a secondary magnetic field in the vicinity of said substrate, said secondary magnetic field having components perpendicular to the surface of said substrate, said components being substantially equal in magnitude and opposite in direction to said perpendicular components of said component of said fringe field at each portion of said substrate.

10. The apparatus of claim 9 wherein said countermagnet means is positioned adjacent said substrate opposite said cathode assembly.

11. The apparatus of claim 9 or 10 wherein said countermagnet means comprises pole pieces configures in general replication of said cathode magnet means.

12. The apparatus of claim 9 or 10 wherein said cathode magnet means includes pole pieces, and wherein said countermagnet mean includes pole pieces aligned in the same orientation as the pole pieces of the cathode magnet means.

13. The apparatus of claim 9 or 10 wherein said countermagnet means includes pole pieces for shaping said countermagnet field.

14. The apparatus of claim 9 or 10 further comprising a chamber containing said cathode assembly, and wherein said countermagnet is located outside said chamber.

15. The apparatus of claim 9 wherein said countermagnet means comprises magnetic pole means for making uniform said secondary ion flux upon the surface of said substrate.

16. The apparatus of claim 15 wherein said pole pieces are of a size and location selected to make the ion flux across said substrate uniform.

17. The apparatus of claim 15 or 16 wherein said countermagnet is positioned on the side of said substrate opposite the position of said cathode assembly.

18. The apparatus of claim 15 or claim 16 further comprising a chamber containing said cathode assembly wherein said countermagnet is located outside said chamber.

19. Apparatus for sputter coating a substrate, said apparatus comprising:
a cathode assembly including target means composed of coating material and a cathode magnet means for producing a primary magnetic field closely adjacent said target means to enhance bombardment of said target means with a primary ion flux;
means mounting said substrate spaced apart from and facing said cathode target means;
means for directing a secondary ion flux bombardment upon said substrate;
means for making said secondary ion flux upon said substrate uniform across its surface, said means including means for producing a secondary magnetic field in the vicinity of said substrate, and
said countermagnet means having pole pieces of a number, size and spacing so selected to replicate the pole piece number, size and spacing of said cathode magnet means.

20. The apparatus of claim 19 wherein said means for making said secondary ion flux uniform includes countermagnet means for producing a secondary magnetic field in the vicinity of said substrate.

21. The apparatus of claim 20 wherein said countermagnet means has pole pieces of size and location so selected to render ion current measurements across said substrate substantially uniform.

22. The apparatus of claim 20 wherein said countermagnet means is a replication of said cathode magnet means varied in size and shape to render ion current measurements across said substrate substantially uniform.

23. The apparatus of claims 20 or 21 or 22 wherein said primary magnetic field includes fringe field lines extending adjacent to said substrate and has a component substantially perpendicular to said surface, and wherein said secondary magnetic field has field lines with components perpendicular to said surface of said substrate opposite in direction to the component of said primary magnetic fringe field lines perpendicular to the substrate.

24. The apparatus of claim 23 wherein said countermagnet is positioned on the side of said substrate opposite the position of the cathode assembly.

25. The apparatus of claim 23 wherein said countermagnet includes pole pieces for shaping said countermagnet field.

26. The apparatus of claim 23 further comprising a chamber containing the cathode assembly wherein said countermagnet is located outside said chamber.

27. Apparatus for sputter etching a substrate having a surface to be etched, said apparatus comprising:
a cathode assembly including magnet means for producing a primary magnetic field closely adjacent said cathode assembly, said primary magnetic field including a fringe field extending adjacent to said substrate and having a component perpendicular to said surface and greater near an inner portion thereof;
means for creating an etching ion flux to bombard and etch said substrate, and
countermagnet means for inducing a secondary field in the vicinity of said substrate, said secondary countermagnetic field having a component perpendicular to the surface of said substrate which is opposite direction of said perpendicular component of said primary magnetic field.

28. The apparatus of claim 27 wherein said component of said countermagnetic field is substantially equal in magnitude to said perpendicular component of said primary magnetic field in the vicinity of said etching surface, whereby the primary magnetic field in the vicinity of said substrate assumes a substantially flat shape with the magnetic field lines extending substantially parallel to said surface.

29. Apparatus for sputtering coating a substrate, said apparatus comprising:
a cathode assembly including target means composed of coating material and a cathode magnet means for producing a primary magnetic field closely adjacent said target means to enhance ion bombardment of said target means, said primary magnetic field including fringe field lines extending adjacent to said substrate and having a component substantially perpendicular to said surface of the substrate, said fringe field lines tending to form a generally funnel shaped central boundary region;
a means mounting said substrate spaced apart from and facing said cathode target means; and
countermagnet means for producing a secondary magnetic field in the vicinity of said substrate, said secondary magnetic field having field lines with components perpendicular to the surface of said substrate, said perpendicular components being substantially opposite in direction to said perpendicular components of said primary magnetic fringe field lines and of such magnitude that the magnetic field in the vicinity of said substrate is substantially flattened in the vicinity of said surface and said funnel shaped central boundary region is substantially reduced in size.

30. The apparatus of claim 29 wherein the magnitude of said perpendicular components of said secondary magnetic field are substantially equal in magnitude to said components of said primary magnetic firnge field lines.

* * * * *